United States Patent
Sahoo et al.

(10) Patent No.: US 11,545,973 B2
(45) Date of Patent: Jan. 3, 2023

(54) FAST ACTIVE CLAMP FOR POWER CONVERTERS

(71) Applicant: Apple Inc., Cupertino, CA (US)

(72) Inventors: Ashish K. Sahoo, San Jose, CA (US); Brandon Pierquet, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/647,220

(22) Filed: Jan. 6, 2022

(65) Prior Publication Data

US 2022/0131539 A1 Apr. 28, 2022

Related U.S. Application Data

(62) Division of application No. 16/917,215, filed on Jun. 30, 2020, now Pat. No. 11,258,443.

(51) Int. Cl.
*H03K 17/687* (2006.01)
*H02M 1/08* (2006.01)
*H03K 19/20* (2006.01)

(52) U.S. Cl.
CPC ............ *H03K 17/687* (2013.01); *H02M 1/08* (2013.01); *H03K 19/20* (2013.01)

(58) Field of Classification Search
CPC ........ H03K 17/687; H03K 19/20; H02M 1/08
USPC ....... 327/108–112, 427, 434, 437, 180, 309; 326/82, 83, 87
See application file for complete search history.

(56) References Cited

U.S. PATENT DOCUMENTS

| | | | | |
|---|---|---|---|---|
| 4,961,010 A | * | 10/1990 | Davis | ............... H03K 19/00361 326/103 |
| 5,699,000 A | * | 12/1997 | Ishikuri | ............... H03K 17/163 327/170 |
| 6,060,938 A | * | 5/2000 | Morrill | ............ H03K 19/00361 326/27 |
| 9,525,413 B2 | | 12/2016 | Roberts | |

(Continued)

FOREIGN PATENT DOCUMENTS

| | | |
|---|---|---|
| EP | 2320544 A | 5/2011 |
| EP | 2320544 A1 | 5/2011 |

(Continued)

OTHER PUBLICATIONS

Extended European Search Report for EP Patent Application No. 21172903.3 dated Jan. 12, 2022; 7 pgs.

*Primary Examiner* — Tomi Skibinski
(74) *Attorney, Agent, or Firm* — Fletcher Yoder PC (57) ABSTRACT

A switching system can include a main switching device configured to switch a voltage, a gate driver having an output coupled to a drive terminal of the main switching device and configured to deliver a drive signal to the main switching device, and a clamp circuit. The clamp circuit can be coupled to the drive terminal of the main switching device. The clamp circuit can include a logic gate configured to drive a clamp switching device coupled to and configured to clamp a voltage at the drive terminal of the main switching device. A drive signal of the clamp switching device can be substantially complementary to the main switching device drive signal. The logic gate can provide at least a portion of a delay between switching transitions of the main switching device and switching transitions of the clamp switching device.

7 Claims, 4 Drawing Sheets

(56) References Cited

U.S. PATENT DOCUMENTS

| | | |
|---|---|---|
| 9,692,408 B2 | 6/2017 | Roberts |
| 2005/0046446 A1* | 3/2005 | Qureshi ................. G11C 19/00 326/95 |
| 2009/0066402 A1 | 3/2009 | Hiyami |
| 2014/0266323 A1* | 9/2014 | McIntosh ......... H03K 17/08122 327/109 |
| 2015/0171852 A1* | 6/2015 | Pang ................ H03K 17/08104 327/109 |

FOREIGN PATENT DOCUMENTS

| | | |
|---|---|---|
| JP | 2006296119 A | 10/2006 |
| WO | 2011067903 A1 | 6/2011 |

\* cited by examiner

FAST ACTIVE CLAMP FOR POWER CONVERTERS

CROSS-REFERENCE TO RELATED APPLICATIONS

This application claims priority to U.S. patent application Ser. No. 16/917,215, filed Jun. 30, 2020, entitled "Fast Active Clamp for Power Converters," the disclosure of which is incorporated by reference in its entirety for all purposes.

BACKGROUND

In at least some embodiments of switching power converters increase operating frequency may be advantageous. For example, higher switching frequencies can allow for smaller energy storage components, particularly inductors and capacitors used for energy storage. These smaller components may be less expensive and also allow designs to be implemented in smaller spaces, both of which may be advantageous in certain applications. Relatively recently, new semiconductor technologies have been developed that allow for even higher switching frequencies and operating speeds, such as silicon carbide (SiC) and gallium nitride (GaN) switching devices. However, as switching speeds increase, problems can arise in other parts of the circuits. For example high switching speeds can cause high rates of change of voltage with respect to time (i.e., high dV/dt), which can trigger undesirable operations and potentially damage in certain circuits.

SUMMARY

For at least some applications, it may therefore be desirable to provide improved clamping arrangements to mitigate the effects of high dV/dt events associated with higher operating frequencies and faster switching times.

A switching system can include a main switching device configured to switch a voltage, a gate driver having an output coupled to a drive terminal of the main switching device and configured to deliver a drive signal to the main switching device, and a clamp circuit. The clamp circuit can be coupled to the drive terminal of the main switching device. The clamp circuit can include a logic gate configured to drive a clamp switching device coupled to and configured to clamp a voltage at the drive terminal of the main switching device. A drive signal of the clamp switching device can be substantially complementary to the main switching device drive signal. The logic gate can provide at least a portion of a delay between switching transitions of the main switching device and switching transitions of the clamp switching device. At least one of the main switching device and the clamp switching device may be a GaN MOSFET.

The switching system can further include a power supply resistor coupled between a drive terminal of the main switching device and a drive terminal of the clamp switching device.

The logic gate of the clamp circuit can be a NOT gate. The clamp circuit can further include a first RC network coupled between a source of an input control signal and an input of the gate driver and a second RC network coupled between the source of the input control signal and an input terminal of the NOT gate. An RC delay of the first RC network can provide a first delay between transitions of the input control signal and triggering of the gate driver. An RC delay of the second RC network provides a second delay between transitions of the input control signal and transitions of a signal appearing at the input of the logic gate. The second delay may be longer than the first delay.

The second RC network can include a first path that does not impose the second delay and a second path that imposes the second delay. A delay between turn off of the clamp switching device and turn on of the main switching device can be equal to a sum of an intrinsic delay of the gate driver and the first delay less a delay of the logic gate. A delay between turn off of the main switching device and turn on of the clamp switching device can be equal to the second delay less a sum of an intrinsic delay of the gate driver and the first delay plus a delay of the logic gate.

The logic gate can alternatively be a NOR gate. A first input of the NOR gate may be coupled to an input of the gate driver, and a second input of the NOR gate may be coupled to the drive terminal of the main switching device.

A clamp circuit for high speed switching devices can include a clamp switch configured to clamp a voltage at the drive terminal of a switching device and a logic gate configured to drive the clamp switch. A drive signal of the clamp switch may be substantially complementary a drive signal of the switching device The logic gate can provide at least a portion of a delay between switching transitions of the switching device and switching transitions of the clamp switch. The clamp circuit can further include a power supply resistor configured to be coupled between a drive terminal of the switching device and a drive terminal of the clamp switch.

The logic gate of the clamp circuit can be a NOT gate. The clamp circuit can further include a first RC network configured to be coupled between an input control signal a gate driver input of the switching device and a second RC network configured to be coupled between the input control signal and an input of the NOT gate. An RC delay of the first RC network can provide a first delay between transitions of the input control signal and triggering of the gate driver. An RC delay of the second RC network can provide a second delay, longer than the first delay, between transitions of the input control signal and transitions of a signal appearing at the input of the NOT gate. The second RC network can include a first path that does not impose the second delay and a second path that imposes the second delay. A delay between turn off of the clamp switch and turn on of the switching device can be equal to a sum of an intrinsic delay of the gate driver and the first delay less a delay of the logic gate. A delay between turn off of the switching device and turn on of the clamp switch can be equal to the second delay less a sum of an intrinsic delay of the gate driver and the first delay plus a delay of the logic gate.

Alternatively, the logic gate of the clamp circuit can be a NOR gate with a first input terminal configured to be coupled to the input control signal and a second input terminal configured to be coupled to the drive terminal of the switching device.

A clamp circuit for limiting voltage excursions at a terminal can include a clamp switch configured to clamp a voltage at the terminal and a logic gate configured to drive the clamp switch. A drive signal of the clamp switch may be substantially complementary a signal appearing at the terminal. The logic gate can provide inversion of the signal appearing at the terminal and at least a portion of a delay between transitions appearing at the terminal and switching transitions of the clamp switch. The logic gate may be a NOT gate or a NOR gate.

DETAILED DESCRIPTION

In the following description, for purposes of explanation, numerous specific details are set forth to provide a thorough understanding of the disclosed concepts. As part of this description, some of this disclosure's drawings represent structures and devices in block diagram form for sake of simplicity. In the interest of clarity, not all features of an actual implementation are described in this disclosure. Moreover, the language used in this disclosure has been selected for readability and instructional purposes, has not been selected to delineate or circumscribe the disclosed subject matter. Rather the appended claims are intended for such purpose.

Various embodiments of the disclosed concepts are illustrated by way of example and not by way of limitation in the accompanying drawings in which like references indicate similar elements. For simplicity and clarity of illustration, where appropriate, reference numerals have been repeated among the different figures to indicate corresponding or analogous elements. In addition, numerous specific details are set forth in order to provide a thorough understanding of the implementations described herein. In other instances, methods, procedures and components have not been described in detail so as not to obscure the related relevant function being described. References to "an," "one," or "another" embodiment in this disclosure are not necessarily to the same or different embodiment, and they mean at least one. A given figure may be used to illustrate the features of more than one embodiment, or more than one species of the disclosure, and not all elements in the figure may be required for a given embodiment or species. A reference number, when provided in a given drawing, refers to the same element throughout the several drawings, though it may not be repeated in every drawing. The drawings are not to scale unless otherwise indicated, and the proportions of certain parts may be exaggerated to better illustrate details and features of the present disclosure.

Figure 1:
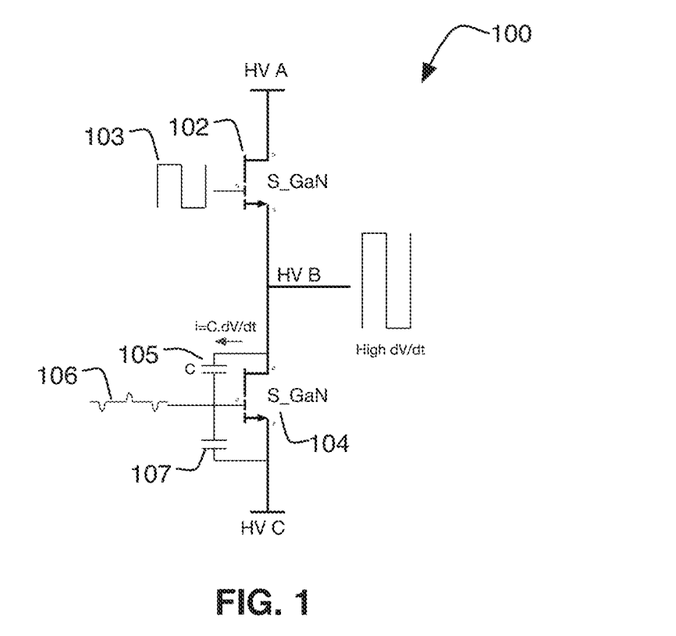
FIG. 1 illustrates a half bridge switching arrangement.

FIG. 1 illustrates a switching arrangement 100 that is made up of a half bridge comprising upper switching device 102 and lower switching device 104. Although disclosed in the context of a half bridge, the circuits and techniques described herein may be applied to any of a variety of switching topologies, such as full bridges or even single switches. In some embodiments, these switching devices may be gallium nitride (GaN) switches, although the circuits and techniques herein may also be applied to other semiconductor technologies. GaN switches may have advantages for certain applications, including small size, and fast switching times allowing for higher operating frequencies. However, in some cases these fast switching times may give rise to other issues.

In operation, upper half bridge switch 102 may be driven with a drive signal 103. Lower half bridge switch 104 may be driven with a complementary signal (not shown) such that switch 102 is on when switch 104 is off, and vice-versa. As a result, the center terminal HVB will alternate between the voltage HVA connected to the upper terminal (drain, if switch 102 is a MOSFET) and the voltage HVC connected to the lower terminal (source, if switch 104 is a MOSFET) at a rate corresponding to the frequency of the applied drive signals. (In all embodiments described herein, main power switching devices and clamp switching devices will be described as MOSFETs; however, other switching device types could also be used.)

As noted above, when fast switches, such as GaN switches, for example, are used, there can be a high rate of change of voltage with time (i.e., a high dV/dt) at terminal HVB. This high dV/dt may induce a current through parasitic capacitances 105, 107 associated with switch 104. The magnitude of this current will be directly proportional to the parasitic capacitance and the dV/dt. In some cases, this current may be large enough to generate voltage pulses 106 that can cause switch 104 to turn on at unintended times, resulting in a "shoot-through" event that can have undesired effects on operation of the circuit. In other cases, negative pulses may be less than the minimum allowable gate-to-source voltage for switch 104, which can result in damage to switch 104.

Figure 2:
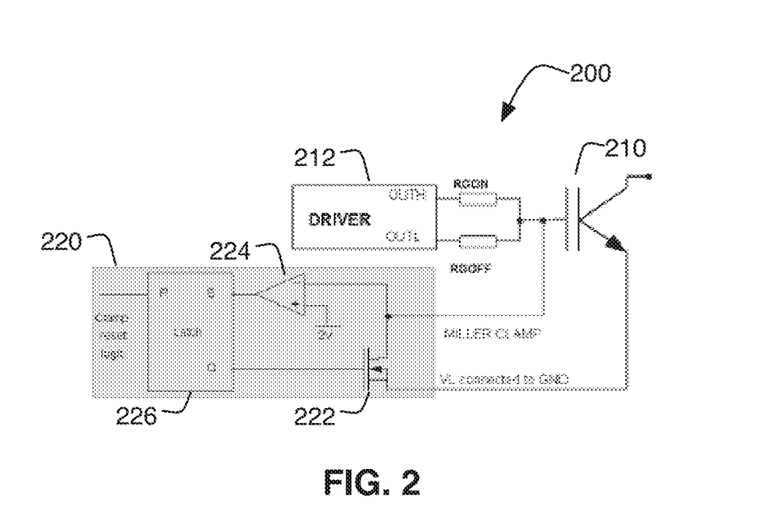
FIG. 2 illustrates a clamping arrangement for a switching device.

FIG. 2 illustrates a switching arrangement 200 that includes an active clamp circuit 220. Active clamp circuit 220 may be employed to prevent voltage excursions at the gate of a switching device 210. Switch 210 may be drive by a driver 212 that provides a high output OUTH to turn on switch 210 and a low output OUTL to turn off switch 210. For example, high output OUTH may source current to turn on switch 210, with resistor RGON providing any required delay or pulse shaping. Similarly, low output OUTL may sink current to turn off switch 210, with resistor RGOFF providing any required delay or pulse shaping. The gate drive signal provided to switch 210 may also be provided to active clamp circuit 220.

Clamp circuit 220 may be considered an "active" clamp because it includes a switching device 222 that operates as follows. Clamp circuit 220 may be provided as a single integrated circuit. The drive signal/gate voltage for main switch 210 is provided to an input of comparator 224, which compares this signal to a predetermined reference value (e.g., 2V). If the gate voltage exceeds the predetermined threshold, the output of comparator 224 goes high, triggering SR flip-flop 226. When the output Q of flip-flop 226 goes high, it turns on the gate of clamp switch 222, which has its drain coupled the gate of main switch 210 and its source coupled to ground. Thus, when clamp switch 222 turns on, the gate voltage of main switch 210 is clamped to ground, which can prevent undesirable excursions of the gate voltage described below. Clamp reset logic (not shown) may be coupled to the reset input of flip-flop 226, allowing the clamp to be reset and ready to operate again on a subsequent switching cycle.

One potential issue with clamp circuit 220 is that the time required for it to operate may be greater than the relevant switching time for switch 210, particularly if switch 210 is implemented using a fast switching semiconductor type, such as GaN (or even SiC or other semiconductor technologies). More specifically, comparator 224 takes a certain amount of time to perform the comparison of gate drive. Likewise, flip-flop 226 requires a certain amount of time to operate after it receives the high output from comparator 224. Finally, clamp switch 222 requires a certain amount of time to turn on after it receives a high gate drive signal from flip flop 226. The sum of these operating times is a delay between the beginning of an undesired voltage excursion at the gate of main switch 210 and the time at which clamp switch 222 is engaged. In some applications, this delay may be too long, resulting in one or more of the undesirable effects associated with such voltage excursions that were discussed above. In other applications, it may be difficult to control one or more of these delays, thus complicating timing of the clamp operation.

Figure 3:
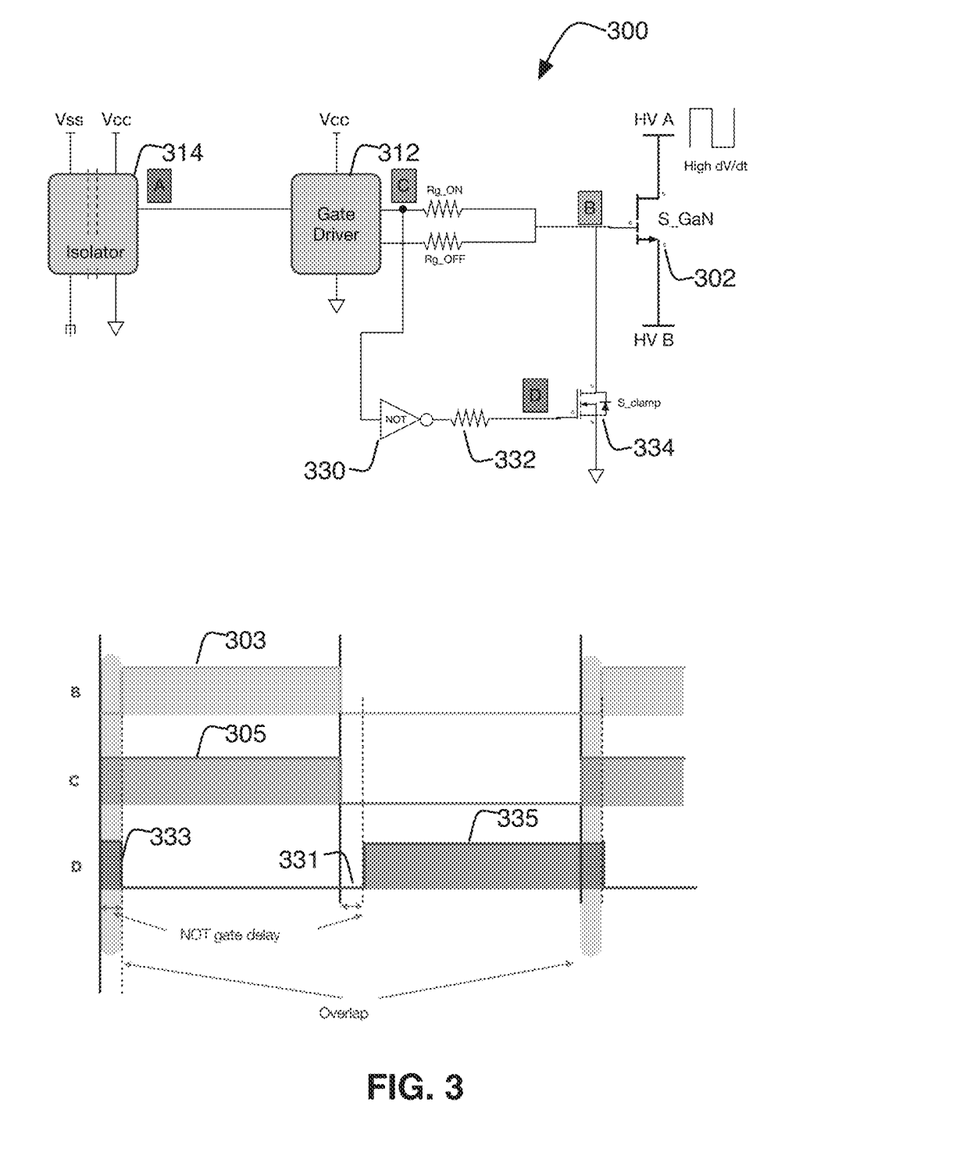
FIG. 3 illustrates an improved clamping arrangement and associated timing diagrams.

FIG. 3 illustrates an alternative improved clamp design that can be used to address the deficiencies of clamp arrangements like that in FIG. 2. FIG. 3 illustrates a switching system 300 that includes a main switching device 302. This may correspond to the upper half of the half bridge switching arrangement discussed above with respect to FIG. 1, or may be part of any other switching arrangement. Main switching device 302 receives its drive signal from a gate driver 312, which may provide on/off drive signals via resistors Rg_ON and Rg_OFF as described above. The gate drive ON trigger signal is denoted "C" in FIG. 3, and the resulting gate drive signal and gate voltage are denoted as "B" in FIG. 3, including in the timing diagram discussed in greater detail below.

Gate driver 312 may receive its input signal from a signal source, such as isolator 314. Isolator 314 may be used to provide isolation between high voltages associated with the switching sides of the circuit and the lower control voltages. The isolation may come from either optical coupling (i.e., an optocoupler), an instrument transformer, or other suitable arrangement. In some embodiments, isolator 314 may be integrated with gate driver 312, in which case the input signal will come directly from a control loop or other source configured to control switching of main switch 302. In other embodiments, the input signal to gate driver 312 may come directly from another source, such as a control loop, without isolation.

Switching arrangement 300 also includes a clamp circuit made up of NOT gate 330, clamp switch 334, and optional resistor 332. The basic operation of clamp circuit is: (1) sense the turn on/trigger signal C that initiates turn on of main switch 302, (2) use this trigger voltage to derive the gate drive signal for clamp switch 334, and (3) more specifically, use a NOT gate (or other inverting logic) to generate complementary logic for the clamp drive signal. By complementary logic it is meant that, roughly speaking, clamp switch 334 is off when main switch 302 is on and vice-versa. As explained in greater detail below, the complementary nature of these switching operations are not strict. For example, as illustrated in the timing diagrams of FIG. 3 and discussed in greater detail below, there is a slight delay between turn off of main switch 302 and turn on of clamp switch 334. Likewise, there is a slight delay between turn on of main switch 302 and turn off of clamp switch 334, resulting in a slight overlap. This arrangement may be variously described herein, as "complementary" or "substantially complementary." Likewise, other active clamp embodiments described below with respect to FIGS. 4A, 4B, 5A, and 5B employ similar switching arrangements in which main switch is on roughly when the clamp switch is off and vice-versa, with varying amounts of delay. These arrangements, too, are described using "complementary" or "substantially complementary."

More detailed understanding of the clamp circuit of FIG. 3 may be gained by considering the operation of the circuit with respect to the timing diagram in the lower portion of the figure. Assume that main switch 302 is turned on (and has been turned on for some amount of time). Gate drive signal B is therefore "high" as illustrated by signal 303. This gate drive signal triggered by trigonal signal C/305, which is slightly ahead (alternatively turn on of gate drive signal B/303 may be considered to be slightly behind trigger signal B/305 because of resistor Rg_ON.) Trigger signal C/305 is received by NOT gate 330, which inverts the signal to "low" generating signal "D," which is applied it to the gate of clamp switch 334, which results in turning off clamp switch 334 and maintaining it in an off state. As noted above, switching devices herein are illustrated as MOSFETs, thus the "gate" is the drive terminal or control terminal of clamp switch 334. However, for other switch types, different terminology may apply. Optional resistor 332 may be provided to tune the turn-on/turn-off transition time and/or manipulate the rising/falling edge of this signal as desired.

At a time determined by the input signal to gate driver 312, main switch 302 will be turned off. More specifically, gate driver 312 will assert a low signal that will pull down gate voltage signal B. Trigger signal "C" also transitions low, which, as noted above, is also provided to the input of NOT gate 330. Thus, after a short delay time 331 NOT gate 330 asserts a high signal 335 at its output, turning on clamp switch 334. At a subsequent time also determined by the input signal to gate driver 312, main switch will be turned on again. In other words, gate driver 312 will be triggered to generate a high signal at its output, causing gate voltage B to transition high (303). This high signal will result in a transition of clamp switch gate drive low after a delay period resulting in turn-on overlap of the main and clamp switches, depicted by overlapping clamp switch gate drive signal 333.

The clamp circuit depicted in FIG. 3 can prevent undesirable voltage excursions at the gate of main switch 302 caused by high dV/dt events associated with the switching transitions of main switch 302. However, in some applications the overlap caused by the delay between turn on of main switch 302 and turn off of clamp switch 334 can result in reduced efficiency, transient ringing, and other effects that it may be preferable to avoid in some cases. Thus, alternative clamp circuit arrangements that eliminate this overlap, such as those illustrated in FIGS. 4A, 4B, 5A, and 5B may be employed. As described in greater detail below, these arrangements also employ logic gates in the clamp circuit to provide a drive signal for switching the active clamp switch complementarily or substantially complementarily with respect to the main switch.

Figure 4A:
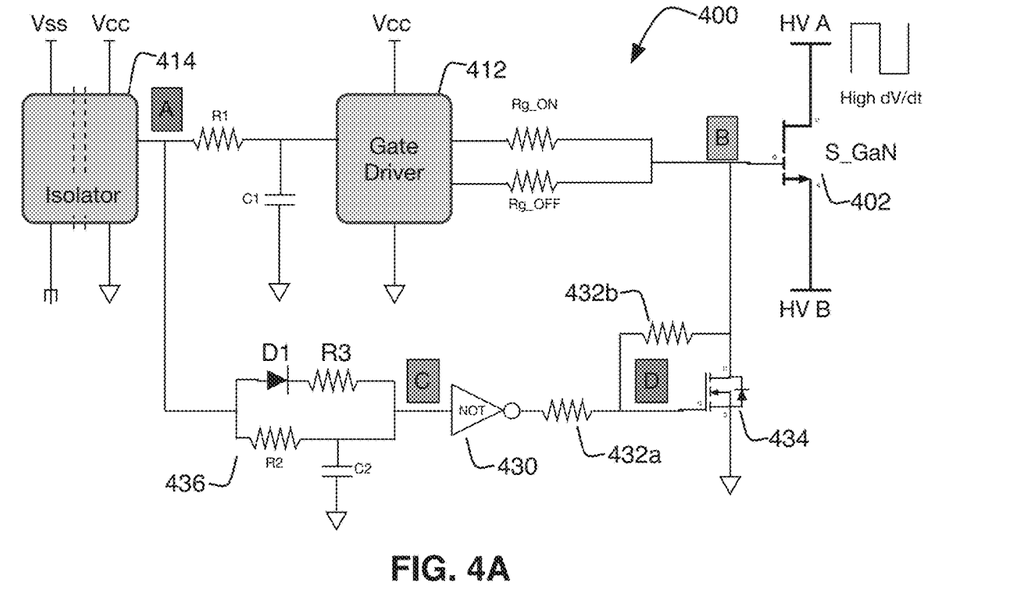
FIG. 4A illustrates an alternative improved clamping arrangement.

FIG. 4A illustrates a switching arrangement 400 employing another logic gate based active clamp design. Switching arrangement 400 includes a main switch 402, which can correspond to the main switching devices discussed above. Main switch 402 may be driven by a gate driver 412, which may be the same as or similar to gate driver 312 discussed above. An optional isolator 414 may be provided, which may be the same as or similar to isolator 314 discussed above. The clamp circuit of switching arrangement 400 can include RC network 436, NOT gate 430, optional resistors 432a and 432b, and clamp switch 434. Operation of the clamp circuit may be understood with respect to the timing diagrams in FIG. 4B and the description following below.

Figure 4B:
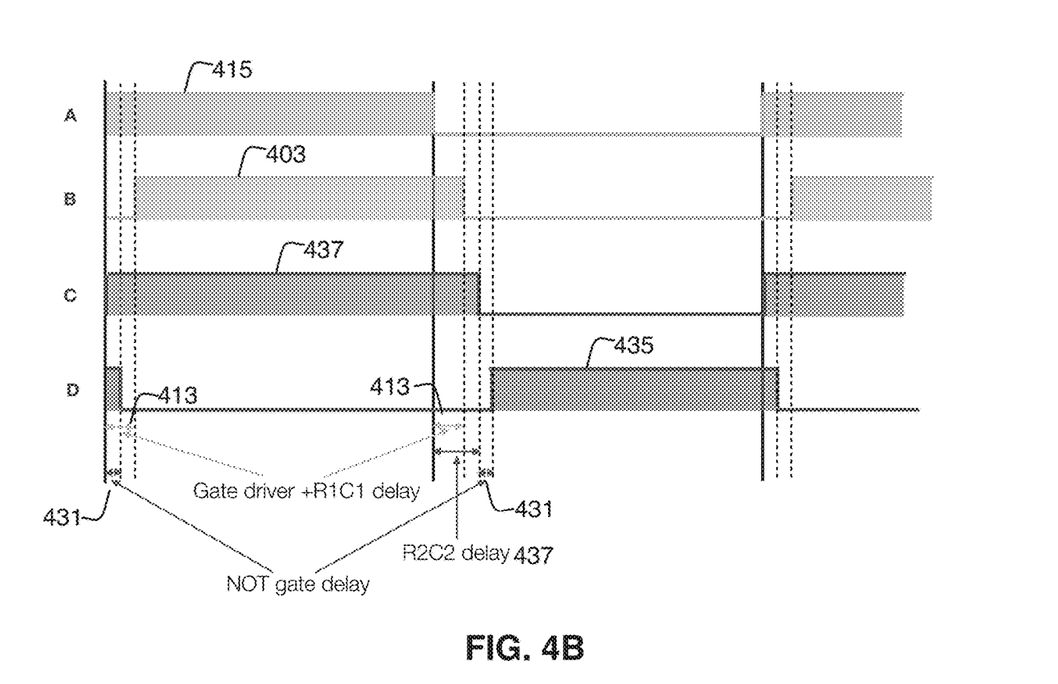
FIG. 4B illustrates timing diagrams associated with the clamping arrangement of FIG. 4A.

At an initial time, signal A, corresponding to the control circuit's turn on signal for main switch 402 transitions high, as depicted by signal 415 in the timing diagram of FIG. 4B. This high signal is delivered to the input of gate driver 412 after a delay determined by the time constant of an RC circuit made up of resistor R1 and capacitor C1, which is interposed between signal source/isolator 414 and an input of gate driver 412. After this "R1C1" delay and any delay inherent in the gate driver itself, the output of gate driver 412 will drive the gate (drive terminal) of main switch 402 high, depicted by signal B/403 in the timing diagram of FIG. 4B. The total delay 413 between input signal A/415 transitioning high and gate voltage B/403 transitioning high is determined by the R1C1 delay plus the internal delay inherent in gate driver 412. In any case, main switch 402 will turn on when the gate drive signal B/403 transitions high. Delay 413 is thus the time between input signal A/415 transitioning high and the turn on of main switch 402.

Contemporaneously with the operations described in the preceding paragraph, gate driver input signal A/415 is also provided to the input of RC network 436. This signal will propagate along the path defined by diode D1 and resistor R3 to the input of NOT gate 430. The signal C appearing at the input of NOT gate 430 is depicted by signal 437 in the timing diagram of FIG. 4B. As can be seen, signal C/437 transitions high substantially simultaneously with gate driver input signal A/415 transitioning high, as diode D1 and resistor R3 provide a bypass around resistor R2 and capacitor C2 (described in greater detail below). NOT gate 430 inverts signal C/437, providing a signal D/435, that may be applied to the drive terminal (i.e., gate) of clamp switch 434. This low gate drive signal for clamp switch 434 is delayed by a NOT gate delay 431, resulting in clamp switch 434 being turned off complementarily or substantially complementarily with the turn on of main switch 402. More specifically, delay 413, associated with R1/C1 and the gate driver inherent delay, may be configured to be longer than not gate delay 431 so that clamp switch 434 turns off prior to the turn on of main switch 402.

At a subsequent time determined by the control circuit (not shown), gate driver input signal A/415 may transition low, ultimately resulting in turn off of main switch 402 and turn on of clamp switch 434 as described in greater detail below. Specifically, after a delay determined by RC circuit R1/C1, the low input signal A/415 reaches an input of gate driver 412. After the gate driver's internal delay, gate drive signal B/403 transitions low, resulting in a turn off of main switch 402. In other words, main switch 402 turns off after a delay period 413 corresponding to the sum of the R1/C1 delay and the intrinsic/inherent delay of gate driver 412.

Contemporaneously with the operations described in the preceding paragraph, low input signal A/415 is also provided to the input of RC network 436. After a delay determined by R2/C2, signal C/437 appearing at the input of NOT gate 430 also transitions low. It will be appreciated that although the low-to-high transition of input signal A/415 bypasses R2/C2, diode D1 prevents this bypassing action for the high-low transition, thus delay between signals A/415 and C/437 is different in the turn-on and turn-off regimes. Once input signal C/437 transitions low, after not gate delay 431, output signal D/435 transitions high, turning on clamp switch 434. The "R2C2" delay 437 may be selected such that it is longer than the "R1C1" delay 413, so that clamp switch 434 does not turn on until after main switch 402 has turned off, resulting in clamp switch 434 being turned on complementarily or substantially complementarily with the turn off of main switch 402.

Also illustrated in FIG. 4A are optional resistors 432a and 432b. Optional resistor 432a corresponds to resistor 332 discussed above with respect to FIG. 3, and provides any desired delay/wave shaping between NOT gate 430 and the drive terminal (gate) of clamp switch 434. Optional resistor 432b may be provided to allow the clamp to operate even when power is lost due to use of a bootstrap bias supply rather than a continuous bias supply.

Figure 5A:
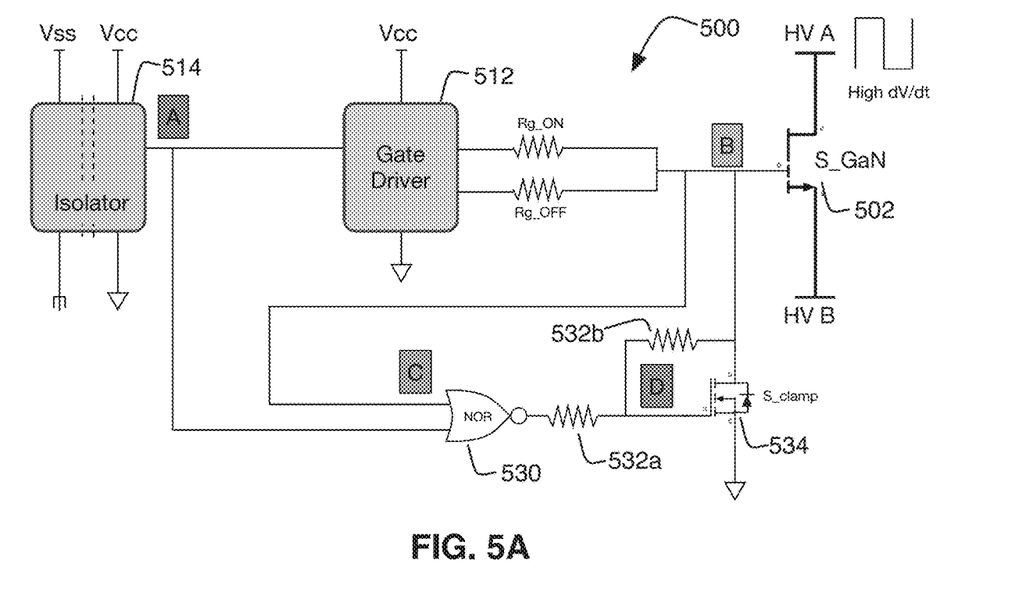
FIG. 5A illustrates another alternative improved clamping arrangement.

FIG. 5A illustrates a switching arrangement 500 employing another logic gate based active clamp design. Switching arrangement 500 includes a main switch 502, which can correspond to the main switching devices discussed above. Main switch 502 may be driven by a gate driver 512, which may be the same as or similar to gate drivers 312 and 512 discussed above. An optional isolator 514 may be provided, which may be the same as or similar to isolators 314 and 414 discussed above. The clamp circuit of switching arrangement 400 can include, NOR gate 530, optional resistors 532a and 532b, and clamp switch 534. Operation of the clamp circuit may be understood with respect to the timing diagrams in FIG. 5B and the description following below.

Figure 5B:
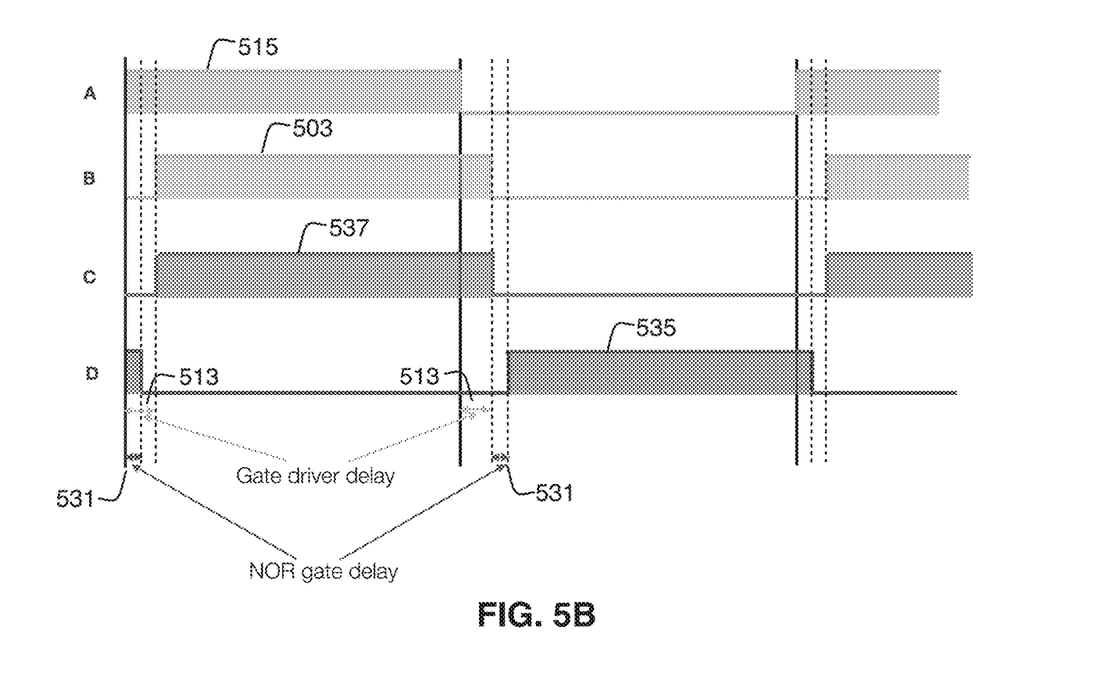
FIG. 5B illustrates timing diagrams associated with the clamping arrangement of FIG. 5A.

At an initial time, signal A, corresponding to the control circuit's turn on signal for main switch 502 transitions high, as depicted by signal 515 in the timing diagram of FIG. 5B. This high signal is delivered to the input of gate driver 512. After the intrinsic delay of gate driver 512, the output of gate driver 512 will drive the gate (drive terminal) of main switch 502 high, depicted by signal B/503 in the timing diagram of FIG. 5B. Main switch 502 will turn on when the gate drive signal B/503 transitions high. Delay 513 is thus the time between input signal A/515 transitioning high and the turn on of main switch 502.

Contemporaneously with the operations described in the preceding paragraph, gate driver input signal A/515 is also provided to a first input of NOR gate 530. The drive terminal (gate) voltage of main switch 502 (i.e., signal B/503) is provided to a second input of NOR gate 530. This signal is also represented by signal C/537 in the timing diagram of FIG. 4B. In other words, signals B/503 and C/537 are the same signal. The output of NOR gate 530, represented as signal D/535 may be used to drive clamp switch 534.

NOR gate 530 will provide a high at its output when neither input signal A/514 nor main switch drive voltage B/503 (which is also signal C/537) is high, as depicted in FIG. 5B. Thus, clamp switch 534 will be turned on when input signal A/515 is low and main switch 502 is turned off. When either or both of input signal A/514 or main switch drive voltage B/503 (aka C/537) is high, the output of NOR gate 530 will be low. Thus, clamp switch 534 will be turned off when input signal A/515 is high and/or when main switch 502 is turned on. As depicted in FIG. 5B, the turn on of clamp switch 534 occurs after input signal 515 is de-asserted and after main switch 502 is turned off. Between de-assertion of input signal A/515 and turn on of clamp switch 534, there is a delay equal to the sum of the gate driver delay 513 and the NOR gate delay 531. Similarly, there is a delay equal to the NOR gate delay between turn off of main switch 502 and turn on of clamp switch 534. Thus, clamp switch 534 is turned on complementarily or substantially complementarily with turn off of main switch 502.

Also illustrated in FIG. 5A are optional resistors 532a and 532b. Optional resistor 532a corresponds to resistor 532 discussed above with respect to FIG. 3 and to resistor 432 discussed above with respect to FIG. 4.A. Resistor 532a may provide any desired delay/wave shaping between NOR gate 530 and the drive terminal (gate) of clamp switch 534. Optional resistor 532b corresponds to resistor 432b discussed above with respect to FIG. 4A and may be provided to allow the clamp to operate even when power is lost due to use of a bootstrap bias supply rather than a continuous bias supply.

The clamp circuits illustrated in FIGS. 3, 4A, 4B, 5A, and 5B can provide a number of advantages. For example, example each clamp circuit uses only a single logic gate (plus a few passive components in at least some embodiments) to drive the active clamp switching device, greatly simplifying the clamp triggering and reset logic. In other words, because the main switch gate drive signal is used in conjunction with the logic gate to drive the clamp switch drive signal and reset signal, the comparator and flip flop arrangement illustrated in FIG. 2 may be omitted. This reduced component count can reduce cost and size/volume/footprint of the clamp arrangement. Likewise, these arrangements can result in very low delays and fast responses that are well suited to modern fast control loops, high switching frequencies, and fast switching times associated with modern semiconductor technologies. Additionally, rather than the integrated circuit solution of FIG. 2, a discrete active clamp switch may be positioned at any location in the circuit and may advantageously be positioned close to the main switch, which can minimize parasitic inductance associated with the clamp circuit connection.

The foregoing describes exemplary embodiments of logic gate based clamp circuits for high speed switches. Such systems may be used in a variety of applications but may be particularly advantageous when used in conjunction with GaN, SiC, or other semiconductor technologies with high switching speeds. Although numerous specific features and various embodiments have been described, it is to be understood that, unless otherwise noted as being mutually exclusive, the various features and embodiments may be combined various permutations in a particular implementation. Thus, the various embodiments described above are provided by way of illustration only and should not be constructed to limit the scope of the disclosure. Various modifications and changes can be made to the principles and embodiments herein without departing from the scope of the disclosure and without departing from the scope of the claims.

The invention claimed is:

1. A switching system comprising:
    a main switching device configured to switch a voltage;
    a gate driver having an output coupled to a drive terminal of the main switching device and configured to deliver a drive signal to the main switching device; and
    a clamp circuit coupled to the drive terminal of the main switching device, the clamp circuit comprising a NOR gate configured to drive a clamp switching device coupled to and configured to clamp a voltage at the drive terminal of the main switching device, wherein:
        a drive signal of the clamp switching device is substantially complementary to the main switching device drive signal; and
        the NOR gate provides at least a portion of a delay between switching transitions of the main switching device and switching transitions of the clamp switching device.

2. The switching system of claim 1 wherein at least one of the main switching device and the clamp switching device is a GaN MOSFET.

3. The switching system of claim 1 further comprising a power supply resistor coupled between a drive terminal of the main switching device and a drive terminal of the clamp switching device.

4. The switching system of claim 1 wherein a first input of the NOR gate is coupled to an input of the gate driver and a second input of the NOR gate is coupled to the drive terminal of the main switching device.

5. A clamp circuit for high speed switching devices, the clamp circuit comprising:
    a clamp switch configured to clamp a voltage at a drive terminal of a switching device; and
    a NOR gate configured to drive the clamp switch, wherein:
        a drive signal of the clamp switch is substantially complementary a drive signal of the switching device; and
        the NOR gate provides at least a portion of a delay between switching transitions of the switching device and switching transitions of the clamp switch.

6. The clamp circuit of claim 5 further comprising a power supply resistor configured to be coupled between a drive terminal of the switching device and a drive terminal of the clamp switch.

7. The clamp circuit of claim 5 wherein a first input terminal of the NOR gate is configured to be coupled to an input control signal and a second input terminal of the NOR gate is configured to be coupled to the drive terminal of the switching device.

* * * * *